United States Patent
Juang et al.

(10) Patent No.: US 9,362,907 B2
(45) Date of Patent: Jun. 7, 2016

(54) METHOD OF DYNAMICALLY ADJUSTING THRESHOLD VALUES AND RELATED ELECTRONIC DEVICE

(75) Inventors: Guan-Ching Juang, Taoyuan County (TW); Chi-Jung Tseng, Taoyuan County (TW); Jen-Hsuen Huang, Taoyuan County (TW); Fa-Da Lin, Taoyuan County (TW)

(73) Assignee: HTC Corporation, Taoyuan District, Taoyuan (TW)

( * ) Notice: Subject to any disclaimer, the term of this patent is extended or adjusted under 35 U.S.C. 154(b) by 1102 days.

(21) Appl. No.: 13/306,968

(22) Filed: Nov. 29, 2011

(65) Prior Publication Data

US 2012/0303316 A1    Nov. 29, 2012

Related U.S. Application Data

(60) Provisional application No. 61/418,412, filed on Dec. 1, 2010.

(51) Int. Cl.
| | |
|---|---|
| *G01C 5/02* | (2006.01) |
| *G06F 3/01* | (2006.01) |
| *G21C 17/02* | (2006.01) |
| *G21C 17/025* | (2006.01) |
| *H03K 17/945* | (2006.01) |

(52) U.S. Cl.
CPC .... *H03K 17/945* (2013.01); *H03K 2217/94026* (2013.01)

(58) Field of Classification Search
CPC ....................................................... H04W 4/00
USPC ............... 702/48, 55, 60, 150, 179, 182, 183;
370/392; 710/46, 300
See application file for complete search history.

(56) References Cited

U.S. PATENT DOCUMENTS

| | | | |
|---|---|---|---|
| 5,224,151 A | 6/1993 | Bowen et al. | |
| 6,640,268 B1 * | 10/2003 | Kumar | 710/46 |
| 6,898,652 B2 * | 5/2005 | Peters et al. | 710/300 |
| 6,898,751 B2 * | 5/2005 | Aikawa et al. | 714/748 |
| 7,554,983 B1 * | 6/2009 | Muppala | 370/392 |

(Continued)

FOREIGN PATENT DOCUMENTS

| | | |
|---|---|---|
| CN | 1540994 A | 10/2004 |
| CN | 101807388 A | 8/2010 |

(Continued)

OTHER PUBLICATIONS

Office action mailed on May 13, 2014 for the China application No. 201110393984.0, filing date: Dec. 1, 2011.

(Continued)

*Primary Examiner* — Gregory J Toatley
*Assistant Examiner* — Felix Suarez
(74) *Attorney, Agent, or Firm* — Winston Hsu; Scott Margo

(57) ABSTRACT

A method of dynamically adjusting threshold values for an electronic device is disclosed. The method comprises setting the base proximity value to a maximum proximity value; polling a detected proximity value; determining a first range where the detected proximity value falls according to a mapping table; setting the base proximity value to a largest value of the first range; determining a high threshold value and a low threshold value according to the base proximity value; and resetting the base proximity value to a default value when the proximity function is disabled.

16 Claims, 3 Drawing Sheets

(56) References Cited

U.S. PATENT DOCUMENTS

| | | |
|---|---|---|
| 7,623,230 B2 | 11/2009 | Porjo |
| 2010/0103151 A1 | 4/2010 | Harada |
| 2010/0240418 A1 | 9/2010 | Matoba |
| 2011/0179368 A1* | 7/2011 | King et al. ............... 715/769 |
| 2011/0202277 A1* | 8/2011 | Haddad ..................... 702/7 |

FOREIGN PATENT DOCUMENTS

| | | |
|---|---|---|
| CN | 101847386 A | 9/2010 |
| EP | 0772300 A2 | 5/1997 |
| TW | 595717 | 6/2004 |
| TW | 200910403 | 3/2009 |

OTHER PUBLICATIONS

Office action mailed on May 27, 2014 for the Taiwan application No. 100144201, filing date: Dec. 1, 2011, p. 1-5.

Office action mailed on Mar. 1, 2013 for the DE application No. 102011055862.4, p. 1-5.

* cited by examiner

METHOD OF DYNAMICALLY ADJUSTING THRESHOLD VALUES AND RELATED ELECTRONIC DEVICE

CROSS REFERENCE TO RELATED APPLICATIONS

This application claims the benefit of U.S. Provisional Application No. 61/418,412 filed on Dec. 1, 2010 and entitled "Dynamic thresholds of proximity sensor by mapping table", the contents of which are incorporated herein.

BACKGROUND

1. Technical Field

The application relates to a method of threshold setting and related electronic device, and more particularly, to a method of dynamically adjusting threshold values and related electronic device.

2. Background

A proximity sensor is used to setup two threshold values. One is a high threshold value and the other is a low threshold value. Proximity interrupt will occur when proximity sensor detected a detected proximity value which is greater than the high threshold value or less than the low threshold value. Proximity interrupt will not occur, when the detected proximity value is greater or equal to the low threshold or when the detected proximity value is lower or equal to the high threshold.

As time goes by, the detected proximity value of the proximity sensor will increase because there will be dust or oil stocked on or blocked the optical path of the proximity sensor. Once the detected proximity value passes over the high threshold setting due to dust or oil accumulation, the proximity sensor would always detect a NEAR signal which indicates an object that is close or in proximity to the proximity sensor. As long as NEAR signal is detected, a FAR signal may not be detected to indicate that there is no object close by anymore. For example, the proximity sensor will proceed with the detection of dust particle as object that is close or in proximity to the proximity sensor. This caused the detected proximity value always higher than the low threshold and a FAR signal is not detected.

When an incoming call is received, the phone application (AP: Application Program) executed in CPU will enable a proximity sensor via an i2c interface. When the proximity sensor detects any object in proximity via IR LED reflection strength, an interrupt will be triggered to inform the CPU. If the interrupt information indicates NEAR, CPU will disable backlight and touch screen. If the interrupt information indicates FAR, CPU will be informed by a FAR event and enable backlight and touch screen. If there is dust stocked on or blocked the proximity sensor, the proximity sensor always detects a NEAR signal because detected proximity value is always higher then the low threshold. This will result in deactivating the backlight and touch screen during calling operation.

SUMMARY

A method of dynamically adjusting threshold values for an electronic device is disclosed.

The present disclosure discloses a method of dynamically adjusting threshold values for an electronic device. The method comprises setting the base proximity value to a maximum proximity value; polling a detected proximity value; determining a first range where the detected proximity value falls according to a mapping table; setting the base proximity value to a largest value of the first range; determining a high threshold value and a low threshold value according to the base proximity value; and resetting the base proximity value to a default value when the proximity function is disabled.

The present disclosure further discloses an electronic device which comprises an application unit, a proximity sensor, a central processing unit (CPU), a memory and a display. The application unit which may be an application program or phone application is used for enabling a proximity function. The proximity sensor may be any type of capacitive, capacitive displacement sensor, doppler effect (sensor based on effect), eddy-current, inductive, laser rangefinder, magnetic, including magnetic proximity fuse, passive optical (such as charge-coupled devices), passive thermal infrared, photocell (reflective), radar, reflection of ionising radiation, sonar (typically active or passive), infra red sensor, or ultrasonic sensor. The proximity sensor is coupled to the application unit and used for detecting an object or surroundings around the electronic device. The proximity sensor generates a detected proximity value base on the proximity of an object related to the electronic device. The CPU is coupled to the proximity sensor and used for executing a process to dynamically adjust threshold values. The process comprises polling a detected proximity value; setting a base proximity value to a maximum proximity value; determining a first range where the detected proximity value falls according to a mapping table; setting the base proximity value to a largest value of the first range; determining a high threshold value and a low threshold value according to the base proximity value and resetting the base proximity value to a default value when the proximity function is disabled.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
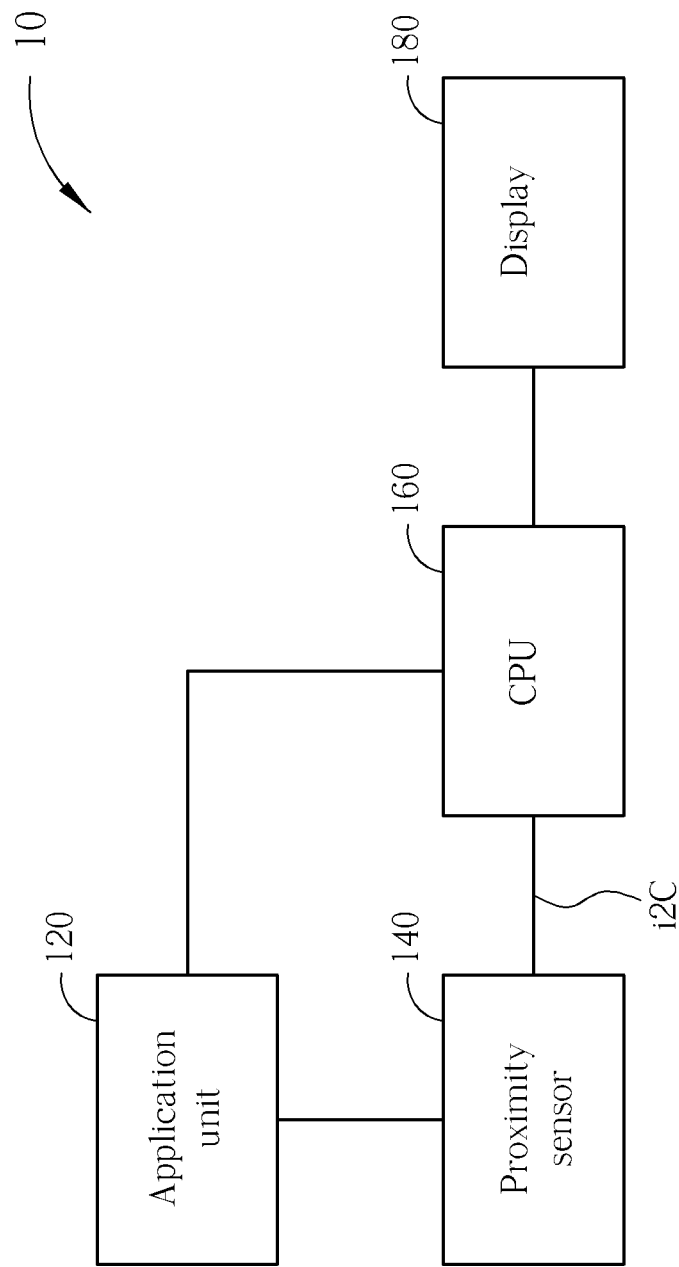
FIG. 1 is a schematic diagram of an exemplary electronic device.

Please refer to FIG. 1, which is a schematic diagram of an electronic device 10. The electronic device 10 may be referred as to, but is not limited to, a mobile phone, a personal assistant (PDA), a music player, a laptop, handheld device, tablet and a portable audio electronic device. The electronic device 10 includes an application unit 120, a proximity sensor 140, a central processing unit (CPU) 160, and a display 180. The application unit 120 may be software or an application installed in the electronic device 10 and is used for enabling a proximity function. The proximity function is performed by the proximity sensor 140. The proximity sensor 140 may detects nearby objects without any physical contact and generates a detected proximity value $PV_{detect}$. The detected proximity value $PV_{detect}$ goes higher when the object gets closer to the electronic device. The detected proximity value $PV_{detect}$ goes lower when the object is leaving the electronic device. The CPU 160 is coupled to the proximity sensor 140 via an i2c interface and is used for dynamically adjusting a high and low threshold values for the electronic device 10.

When an incoming call is received by the electronic device 10, the application unit 120 enables the proximity sensor 140 to detect proximity around the electronic device 10 and generates the detected proximity value $PV_{detect}$. The CPU 160 initially set a base proximity value $PV_{base}$ to a maximum value $PV_{base\_max}$. Then CPU 160 polls the detected proximity value $PV_{detect}$ from the proximity sensor 140 after proximity sensor 140 is enabled. The CPU 160 determines a first range where the detected proximity value $PV_{detect}$ falls in according to a mapping table. Preferably, the mapping table is predefined and stored in the memory. The CPU 160 sets the base proximity value $PV_{base}$ to the largest value of the first range. The CPU 160 stores the base proximity value $PV_{base}$ in its memory (e.g. RAM). Once system changes to a new base proximity value $PV_{base}$, it updates the high and low threshold values. The CPU 160 sends the updated high and low threshold values back to the proximity sensor 140.

When the detected proximity value $PV_{detect}$ under the influence of the dust or oil accumulation on the proximity sensor, the detected proximity value $PV_{detect}$ does not reflect the condition of the object related to the proximity sensor. The electronic device 10 would dynamically adjusts the base proximity value $PV_{base}$ based on the detected proximity value. Further, the proximity value $PV_{base}$ would updates the new high and low threshold values. In other words, different high and low threshold values are set or assigned according to different conditions with the detected proximity value $PV_{detect}$. As a result, the proximity sensor 140 may detects FAR signals when an object is leaving the electronic device 10 even though dust might have been built up on the proximity sensor 140 as a period of time after use and affect the ability of proximity sensor to detect the proximity of the an object. On the other hand, the present disclosure may avoid that the proximity sensor 140 sends an interrupt to the CPU 160 due to dust accumulation and turns off the backlight of the display 180 when there is no ongoing call.

In addition, multiple ranges may be defined in the mapping table, such as 0~3, 4~6, and 7~9 and so on for different condition and level of proximity sensor interference due to dust or oil accumulation. i.e. 0~3 is a range1 for minor dust accumulation, 4~6 is a range2 for mild oil accumulation and 7~9 is a range3 for server dust and oil accumulation. The value of the range may be varied for different range such as 0~3, 4~5 and 6~17 to accommodate different condition. When the detected proximity value $PV_{detect}$ is read, the detected proximity value $PV_{detect}$ is subjected to what abovementioned ranges. For example, when the detected proximity value $PV_{detect}$ is determined to be 2, the range that the detected proximity value $PV_{detect}$ falls into is the range of 0~3 since the 2 is between range 0~3. The largest value of the subjected range is then used as the base proximity value $PV_{base}$, and the threshold values may be adjusted according to the base proximity value $PV_{base}$ by adding a low value, 5 to base proximity value $PV_{base}$ as the low threshold value and adding a high value, 6 to base proximity value $PV_{base}$ as the high threshold value. The low or high value may be a fixed value for all range or different value depends on different range in different condition. For range 1, the low value may be 5 and high value may be 6 for minor dust accumulation. For range 2 the low value may be 8 and high value may be 10 for mild oil accumulation. For example, if the current detected proximity value $PV_{detect}$ is 11, the proximity value $PV_{detect}$ is subjected to a range between 9 to 12 (i.e. the first range), the base proximity value $PV_{base}$ is set to 12 as the largest value in that range. The low threshold value is set to (12+5)=17, and the high threshold value is set to (12+6)=18. The low or high value may be mathematic formula such as polynomial of the base proximity value $PV_{base}$. For example, if the current detected proximity value $PV_{detect}$ is 11, the proximity value $PV_{detect}$ is subjected to a range between 9 to 12 (i.e. the first range), the base proximity value $PV_{base}$ is set to 12 as the largest value in that range. The low threshold value is set to add two times of the base proximity value $PV_{base}$ (12+2*$PV_{base}$)=36, and the high threshold value is set to add three times of the base proximity value $PV_{base}$ (12+3*$PV_{base}$)=48.

In some examples, the mapping table may be optimized by using polynomial to set different ranges. For example, the proximity value is bound from 0x0 to 0xFF. The mapping table may be designed as follows. Difference of three may be used as the interval between 0x0 and 0x3F, i.e. 0x0, 0x3, 0x6 . . . and so on. Difference of four may be used as the interval between 0x3F~0x6B, i.e. 0x3F, 0x43, 0x47 . . . and so on. The mapping table is built from 0x0 to 0xFF. The largest level should be 0xFF, i.e. $PV_{base\_max}$.

The system continuously may keep changing the base proximity value $PV_{base}$ and the threshold values until proximity sensor 140 is disabled. The system resets the base proximity value $PV_{base}$ and the threshold values to default values after proximity sensor 140 is disabled. The system may change the base proximity value $PV_{base}$ and the threshold values when the phone first start up or when the application program is running or at first run.

Figure 2:
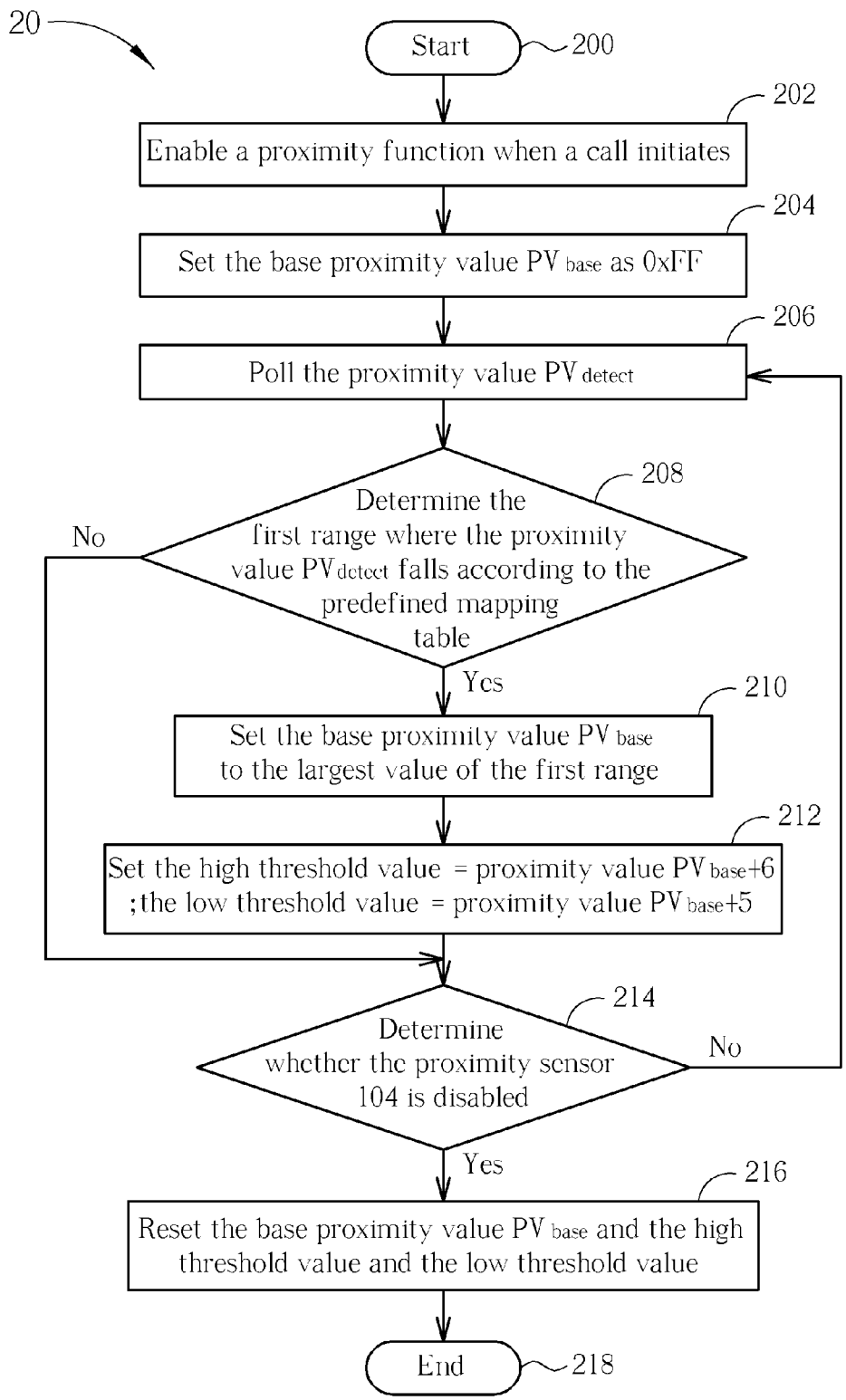
FIG. 2 is a flow chart of an exemplary process.

Please refer to FIG. 2, which is a flow chart of a process 20 according to an operation of the electronic device 10. The process 20 is used in the electronic device 10 for dynamically adjusting the base proximity value $PV_{base}$ and high/low threshold values for the electronic device 10. The process 20 includes the following steps:

Step 200: Start.
Step 202: Enable a proximity function when a call initiates.
Step 204: Set the base proximity value $PV_{base}$ as 0xFF.
Step 206: Poll the proximity value $PV_{detect}$.
Step 208: Determine the first range where the proximity value $PV_{detect}$ falls according to the predefined mapping table.
Step 210: Set the base proximity value $PV_{base}$ to the largest value of the first range.
Step 212: Set "the high threshold value=proximity value $PV_{base}$+6" and "the low threshold value=proximity value $PV_{base}$+5".
Step 214: Determine whether the proximity sensor 104 is disabled. If so, go to the Step 216; if not, go to the Step 206.
Step 216: Reset the base proximity value $PV_{base}$ and the high threshold value and the low threshold value.
Step 218: End.

According to the process 20, the application unit 120 executed in the CPU 160 enables the proximity sensor 140 via the i2c interface when answering a call session or conducting a call session. The proximity sensor 140 may be implemented on a proximity chip. The proximity sensor 140 senses the presence of nearby objects without any physical contact. and generates or produce a detected proximity value $PV_{detect}$ base on the proximity of an object related to the electronic device. The CPU 160 initially sets base proximity value $PV_{base}$ as 0xFF, which is the maximum proximity value of the mapping table. The CPU 160 polls a proximity value $PV_{detect}$ from the proximity sensor 140 via i2c after enabling the proximity sensor 140. The CPU 160 determines the first range where the proximity value $PV_{detect}$ falls according to the predefined mapping table. Multiple ranges may be defined in the mapping table, such as 0~3, 4~6, and 7~9 and so on for different condition and level of proximity sensor interference due to dust or oil accumulation. i.e. 0~3 is a range1 for minor dust accumulation, 4~6 is a range2 for mild oil accumulation and 7~9 is a range3 for server dust and oil accumulation. The value of the range may be varied for different range such as 0~3, 4~5 and 6~17 to accommodate different condition.

Figure 3:
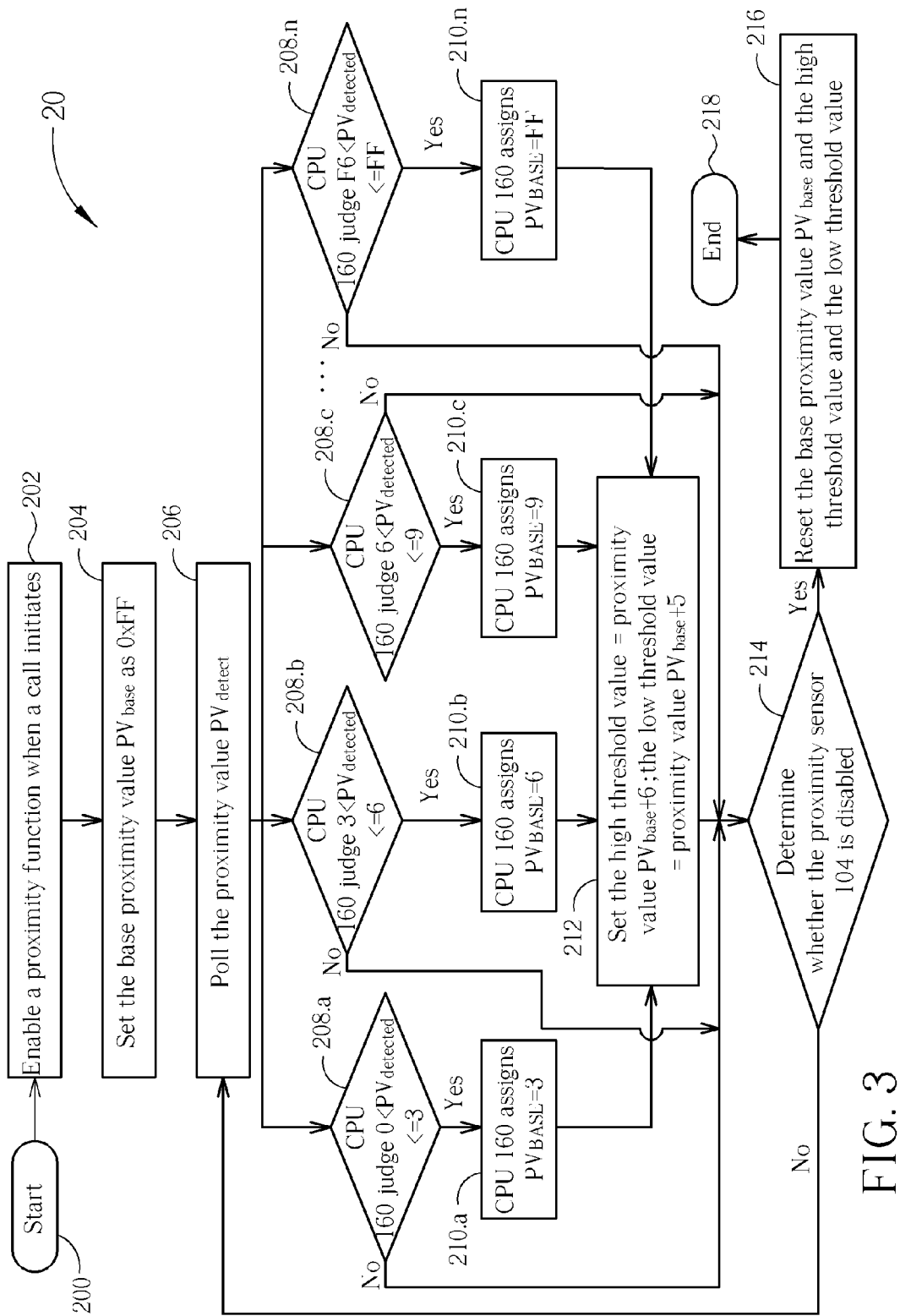
FIG. 3 is a flow chart of an exemplary process.

Please refer to FIG. 3. FIG. 3 is a flow chart of the process 20 in details. The Step 208 and Step 210 are elaborated in FIG. 3 and include sub-steps. In Step 206.a, the CPU 160 compares the proximity value $PV_{detect}$ with ranges. If $0<PV_{detect}<=3$ (i.e. the first range is between 0 to 3), the CPU 160 assigns the largest value, which is 3, in that range as the base proximity value $PV_{base}$ (Step 210.a). The new low threshold vale is set to 8 (3+5) and the new high threshold value is set to 9 (3+6) for the proximity sensor 140 via the i2c interface. The threshold values may be adjusted according to the base proximity value $PV_{base}$ by adding a low value, 5 to base proximity value $PV_{base}$ 8 (3+5) as the low threshold value and adding a high value, 6 to base proximity value $PV_{base}$ 9 (3+6) as the high threshold value. The low or high value may be a fixed value for all range or different value depends on different range in different condition. For range 1, the low value may be 5 and high value may be 6 for minor dust accumulation. For range 2 the low value may be 8 and high value may be 10 for mild oil accumulation. As shown in Step 206.b, if $3<PV_{detect}<=6$ (i.e. the first range is between 3 to 6), the CPU 160 assigns the base proximity value $PV_{base}$ as 6 (Step 210.b). The new low threshold vale is set to 11 (6+5) and sets the new high threshold value is set to 12 (6+6) for the proximity sensor 140 via the i2c interface. If $6<PV_{detect}<=9$ (i.e. the first range is between 6 to 9), the CPU 160 assigns the base proximity value $PV_{base}$ as 9 (Step 210.c). The new low threshold vale to 14 (9+5) and the new high threshold value is set to 15 (9+6) for the proximity sensor 140 via the i2c interface, and so on. There are 58 levels, and only one level will be satisfied. If the proximity value $PV_{detect}$>previous level, the process 20 goes to Step 214 to determine whether the proximity sensor 140 is disabled due to the fact that the call session is ended or instruction from the system to disable the proximity sensor 140. If the proximity sensor 140 is not disabled, the process 20 loops back to poll the proximity value $PV_{detect}$ again and does the same flow as described above. If the proximity sensor 140 is disabled, the CPU 160 resets the base proximity value $PV_{base}$ stored in the CPU 160 to the default value and the high and low thresholds to original settings via the i2c interface.

To sum up, when an incoming call is received, the Phone application enables a proximity sensor to detect a proximity value. Initially, CPU sets a base proximity value to a maximum value (e.g. 0xFF). Then CPU poll values from the proximity sensor after the proximity sensor is enabled. The polled value is then checked to fit in one of many value ranges. The base proximity value is then set to be the largest value in the fitted range (i.e. the first range). Once system changes to the new base proximity value, it updates the HIGH and LOW thresholds. Thus, the present disclosure dynamically adjusts the threshold setting by current detected proximity value and a predefined mapping table. Also, the present disclosure may avoid that the proximity sensor sends an interrupt to the CPU due to dust accumulation and turns off the backlight of the display when there is no ongoing call.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method of adjusting an electronic device having a processing unit and a sensor sensing proximity of an object, the method comprising:

setting a base proximity value to a maximum value in a mapping table by the processing unit;

when a call is received or conducted by the electronic device, enabling a proximity function of the sensor by the processor and generating a detected proximity value by the sensor according to the proximity of the object to the sensor, after enabling the sensor;

determining a first range from the mapping table according to the detected proximity value by the processing unit;

setting the base proximity value to a largest value of the first range by the processing unit;

determining a high threshold value and a low threshold value according to the base proximity value by the processing unit comprising:

setting the high threshold as the base proximity value by adjusting with a high value and setting the low threshold value as the base proximity value by adjusting with a low value; and determining whether the proximity function of the sensor is disabled, wherein if the proximity function of the sensor is not disabled, the above steps are performed again, wherein if the proximity function of the sensor is disabled, resetting the base proximity value, the low threshold and the low threshold to default values.

2. The method of claim 1, wherein determining the high threshold value and the low threshold value according to the base proximity value comprises setting the high threshold as the base proximity value by addition of a high value and set the low threshold value as the base proximity value by addition of a low value.

3. The method of claim 2, wherein the high value is number six and wherein the low value is number five.

4. The method of claim 2, wherein the mapping table has a plurality of ranges.

5. The method of claim 4, wherein the low value or high value is a fixed value for all ranges.

6. The method of claim 4, wherein the low value or high value is different value in different range in the mapping table.

7. The method of claim 2, wherein the low value or high value is polynomial of the base proximity value.

8. The method of claim 5, wherein range of the plurality of ranges is set by using polynomial.

9. The method of claim 1, further comprising establishing the mapping table.

10. The method of claim 9, wherein establishing the mapping table comprising defining a plurality of ranges in the mapping table.

11. An electronic device comprising:

an application unit for enabling a proximity function;

a sensor coupled to the application unit, for sensing an object around the electronic device and generating a detected proximity value; and a processing unit coupled to the sensor, for executing a process to adjust threshold values; and a memory coupled to the processing unit for storing a mapping table, the detected proximity value, a base proximity value, a high threshold value and a low threshold value;

wherein the process comprise:

setting the base proximity value to a maximum value in the mapping table by the processing unit;

when a call is received or conducted by the electronic device, enabling the proximity function of the sensor by the processor and generating the detected proximity value by the sensor according to the proximity of the object to the sensor, after enabling the sensor;

determining a first range from the mapping table according to the detected proximity value by the processing unit;
setting the base proximity value to a largest value of the first range by the processing unit;
determining the high threshold value and the low threshold value according to the base proximity value by the processing unit,
   setting the high threshold as the base proximity value by adjusting with a high value and setting the low threshold value as the base proximity value by adjusting with a low value; and
determining whether the proximity function of the sensor is disabled, wherein if the proximity function of the sensor is not disabled, the above steps are performed again, wherein if the proximity function of the sensor is disabled, resetting the base proximity value, the low threshold and the low threshold to default values.

12. The electronic device of claim 11, wherein process of determining the high threshold value and the low threshold value according to the base proximity value comprises setting the high threshold as the base proximity value by addition of a high value and set the low threshold value as the base proximity value by addition of a low value.

13. The electronic device of claim 11, wherein the high value is number six and wherein the low value is number five.

14. The electronic device of claim 11, wherein the process further comprises determining whether to disable the proximity function.

15. The electronic device of claim 11, wherein the process further comprises establishing the mapping table.

16. The electronic device of claim 11, wherein the mapping table comprises a plurality of ranges.

* * * * *